US 12,148,727 B2

(12) United States Patent
Wirz et al.

(10) Patent No.: US 12,148,727 B2
(45) Date of Patent: *Nov. 19, 2024

(54) SEMICONDUCTOR DEVICE ASSEMBLY WITH DIE SUPPORT STRUCTURES

(71) Applicant: Micron Technology, Inc., Boise, ID (US)

(72) Inventors: Brandon P. Wirz, Boise, ID (US); David R. Hembree, Boise, ID (US)

(73) Assignee: Micron Technology, Inc., Boise, ID (US)

(*) Notice: Subject to any disclaimer, the term of this patent is extended or adjusted under 35 U.S.C. 154(b) by 777 days.

This patent is subject to a terminal disclaimer.

(21) Appl. No.: 17/174,905

(22) Filed: Feb. 12, 2021

(65) Prior Publication Data

US 2021/0167030 A1 Jun. 3, 2021

Related U.S. Application Data

(63) Continuation of application No. 15/603,175, filed on May 23, 2017, now Pat. No. 10,923,447.

(51) Int. Cl.
*H01L 23/00* (2006.01)
*H01L 25/065* (2023.01)

(52) U.S. Cl.
CPC .............. *H01L 24/14* (2013.01); *H01L 24/03* (2013.01); *H01L 24/04* (2013.01); *H01L 24/05* (2013.01);
(Continued)

(58) Field of Classification Search
CPC ..... H01L 2224/0603; H01L 2224/0903; H01L 2224/14515; H01L 2224/14517;
(Continued)

(56) References Cited

U.S. PATENT DOCUMENTS

| 9,607,973 B1 | 3/2017 | Fasano et al. |
| 2003/0102555 A1 | 6/2003 | Patel et al. |

(Continued)

FOREIGN PATENT DOCUMENTS

| CN | 101681886 A | 3/2010 |
| CN | 104241215 A | 12/2014 |
| DE | 10227342 A1 | 1/2004 |
| WO | 2005122706 A2 | 12/2005 |

OTHER PUBLICATIONS

CN Patent Application No. 201880033499.2—Chinese Office Action and Search Report, dated Sep. 27, 2022, with English Translation, 20 pages.

(Continued)

*Primary Examiner* — Kevin Parendo
(74) *Attorney, Agent, or Firm* — Perkins Coie LLP

(57) ABSTRACT

A semiconductor device assembly is provided. The assembly includes a first semiconductor die and a second semiconductor die disposed over the first semiconductor die. The assembly further includes a plurality of die support structures between the first and second semiconductor dies and a plurality of interconnects between the first and second semiconductor dies. Each of the plurality of die support structures includes a stand-off pillar and a stand-off pad having a first bond material with a first solder joint thickness between them. Each of the plurality of interconnects includes a conductive pillar and a conductive pad having a second bond material with a second solder joint thickness between them. The first solder joint thickness is less than the second solder joint thickness.

9 Claims, 8 Drawing Sheets

(52) U.S. Cl.
CPC .............. *H01L 24/06* (2013.01); *H01L 24/11* (2013.01); *H01L 24/13* (2013.01); *H01L 24/16* (2013.01); *H01L 24/17* (2013.01); *H01L 25/0657* (2013.01); *H01L 24/81* (2013.01); *H01L 2224/03462* (2013.01); *H01L 2224/0347* (2013.01); *H01L 2224/0401* (2013.01); *H01L 2224/05023* (2013.01); *H01L 2224/05024* (2013.01); *H01L 2224/05025* (2013.01); *H01L 2224/05073* (2013.01); *H01L 2224/05144* (2013.01); *H01L 2224/05147* (2013.01); *H01L 2224/05564* (2013.01); *H01L 2224/05573* (2013.01); *H01L 2224/05644* (2013.01); *H01L 2224/05647* (2013.01); *H01L 2224/05655* (2013.01); *H01L 2224/0603* (2013.01); *H01L 2224/11462* (2013.01); *H01L 2224/1147* (2013.01); *H01L 2224/13007* (2013.01); *H01L 2224/13023* (2013.01); *H01L 2224/13025* (2013.01); *H01L 2224/13082* (2013.01); *H01L 2224/13083* (2013.01); *H01L 2224/13101* (2013.01); *H01L 2224/13144* (2013.01); *H01L 2224/13147* (2013.01); *H01L 2224/13155* (2013.01); *H01L 2224/1403* (2013.01); *H01L 2224/1412* (2013.01); *H01L 2224/14517* (2013.01); *H01L 2224/16014* (2013.01); *H01L 2224/16052* (2013.01); *H01L 2224/16145* (2013.01); *H01L 2224/16148* (2013.01); *H01L 2224/1703* (2013.01); *H01L 2224/17051* (2013.01); *H01L 2224/17055* (2013.01); *H01L 2224/17517* (2013.01); *H01L 2224/81139* (2013.01); *H01L 2224/81203* (2013.01); *H01L 2224/81801* (2013.01); *H01L 2224/81815* (2013.01); *H01L 2225/06513* (2013.01); *H01L 2225/06541* (2013.01); *H01L 2225/06575* (2013.01); *H01L 2924/3511* (2013.01)

(58) Field of Classification Search
CPC . H01L 2224/14519; H01L 2224/17515; H01L 2224/17519; H01L 2224/14505; H01L 2224/17505
See application file for complete search history.

(56) References Cited

U.S. PATENT DOCUMENTS

| | | |
|---|---|---|
| 2004/0036181 A1 | 2/2004 | Hiedler et al. |
| 2004/0232533 A1 | 11/2004 | Hatakeyama |
| 2004/0238208 A1 | 12/2004 | Andrews et al. |
| 2005/0173796 A1 | 8/2005 | Pflughaupt et al. |
| 2007/0007665 A1 | 1/2007 | Clevenger et al. |
| 2008/0088001 A1 | 4/2008 | Kim et al. |
| 2010/0013032 A1 | 1/2010 | Oppermann et al. |
| 2011/0001250 A1 | 1/2011 | Lin et al. |
| 2011/0101523 A1 | 5/2011 | Hwang et al. |
| 2011/0186978 A1 | 8/2011 | Kim et al. |
| 2012/0001329 A1 | 1/2012 | Kim et al. |
| 2012/0012985 A1 | 1/2012 | Shen et al. |
| 2012/0267779 A1 | 10/2012 | Lin et al. |
| 2013/0277801 A1 | 10/2013 | Chen et al. |
| 2014/0061897 A1 | 3/2014 | Lin et al. |
| 2014/0167254 A1 | 6/2014 | Yu et al. |
| 2014/0353838 A1 | 12/2014 | Lin et al. |
| 2015/0001704 A1 | 1/2015 | Lu et al. |
| 2015/0171038 A1 | 6/2015 | Lin et al. |
| 2015/0228587 A1 | 8/2015 | Cheng et al. |
| 2015/0340343 A1 | 11/2015 | Chen |
| 2016/0079208 A1* | 3/2016 | Heo ................... H01L 25/0657 257/737 |
| 2016/0190080 A1 | 6/2016 | Chen et al. |
| 2017/0170134 A1 | 6/2017 | Audet et al. |
| 2018/0005988 A1 | 1/2018 | Deligianni et al. |
| 2018/0012838 A1 | 1/2018 | Arvin et al. |
| 2018/0342476 A1 | 11/2018 | Wirz et al. |
| 2021/0193606 A1 | 6/2021 | Wirz et al. |

OTHER PUBLICATIONS

International Application No. PCT/US2018/029415—International Search Report and Written Opinion, mailed Aug. 10, 2018, 14 pages.

Office Action and Search Report dated Nov. 12, 2019 for Taiwan Patent Application No. 107115847, 7 pages (with translation).

Office Action mailed May 14, 2019 for Taiwan Patent Application No. 107115847, 9 pages (with translation).

\* cited by examiner

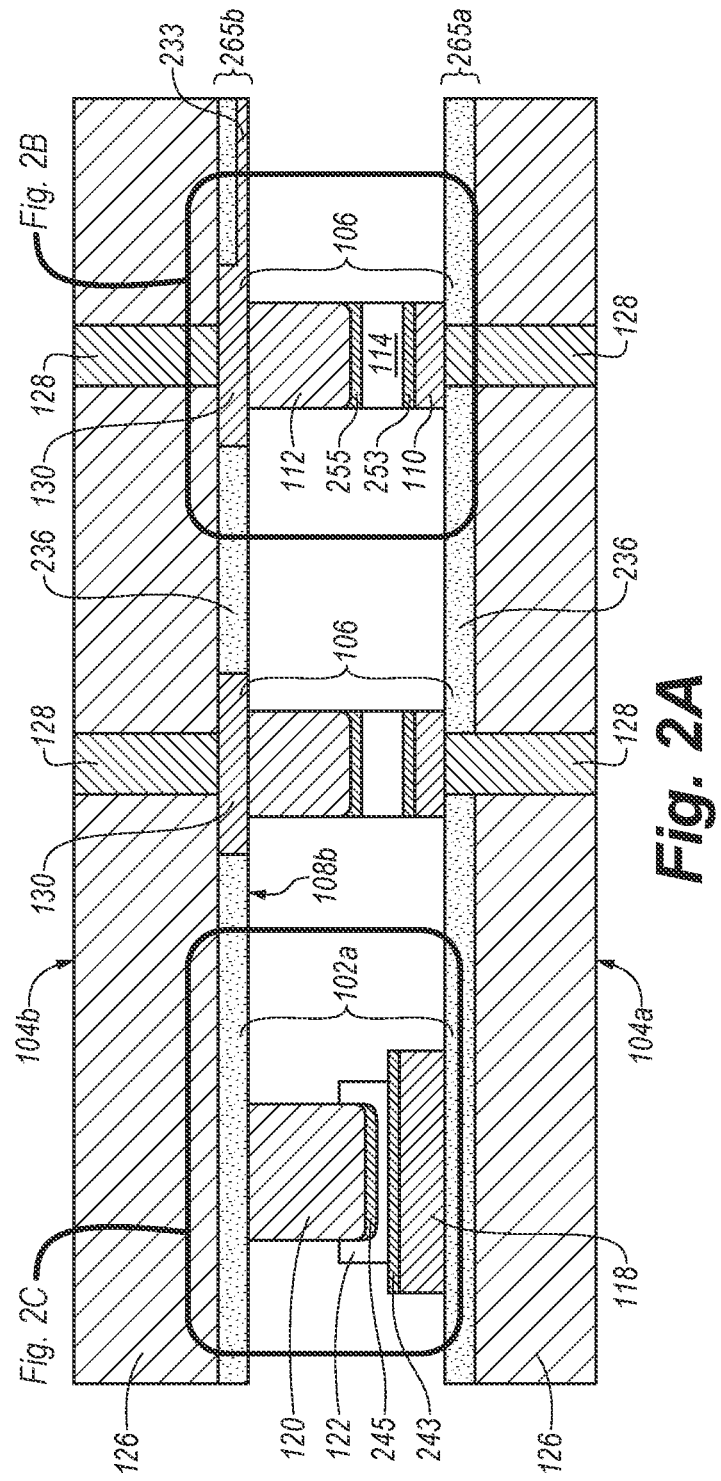

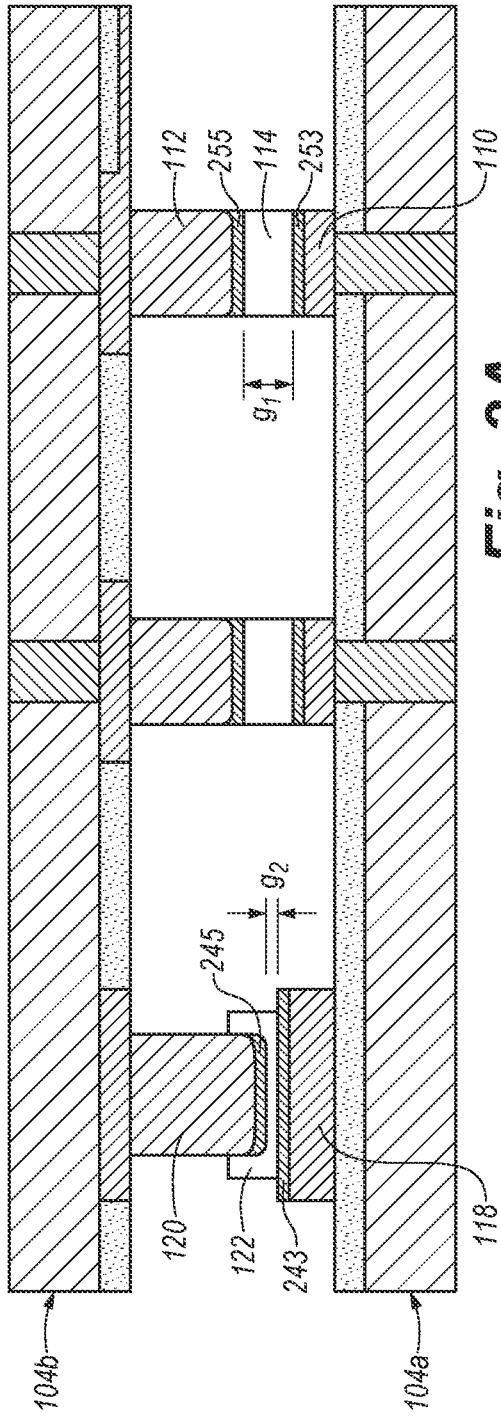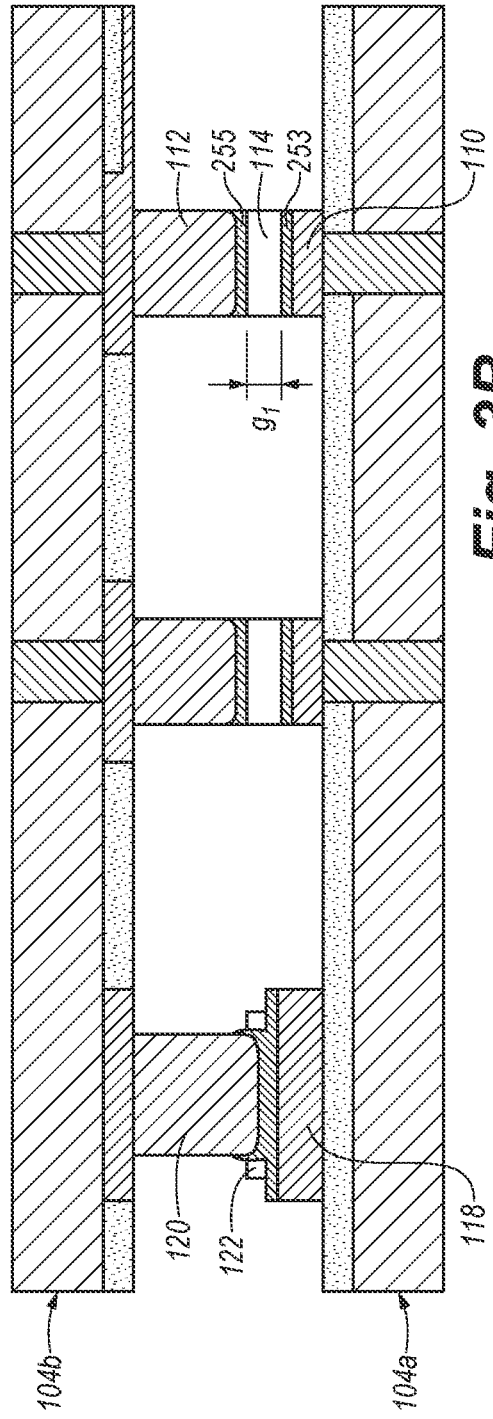

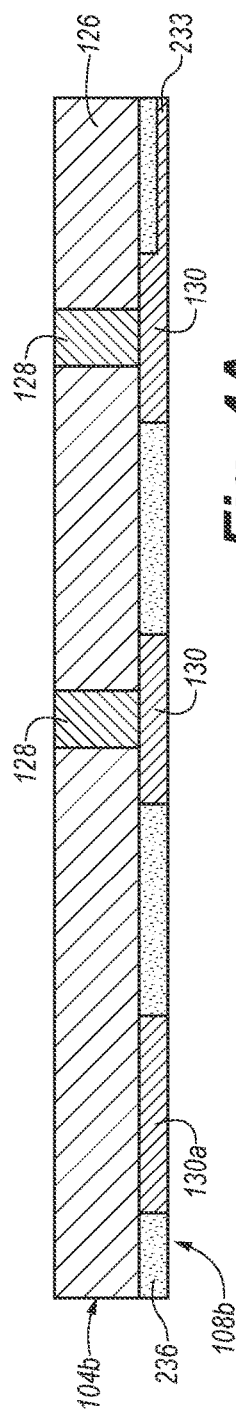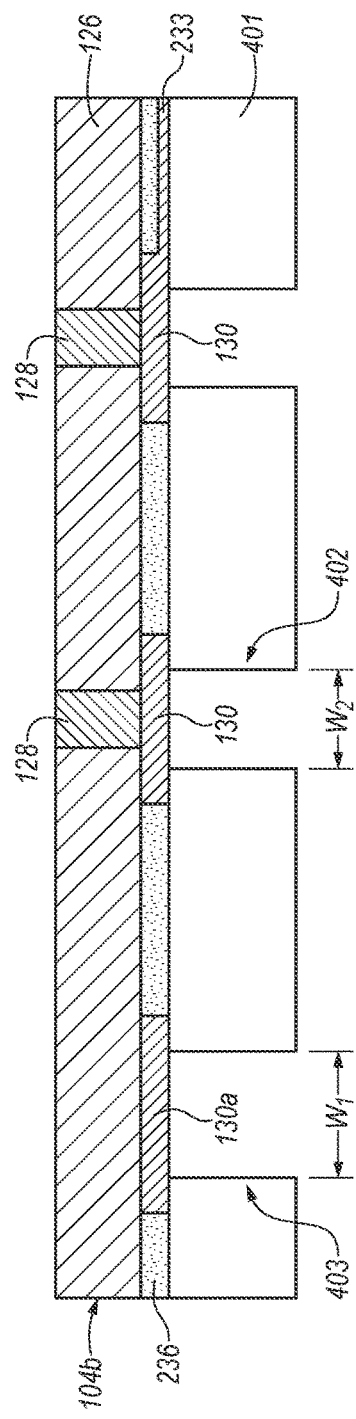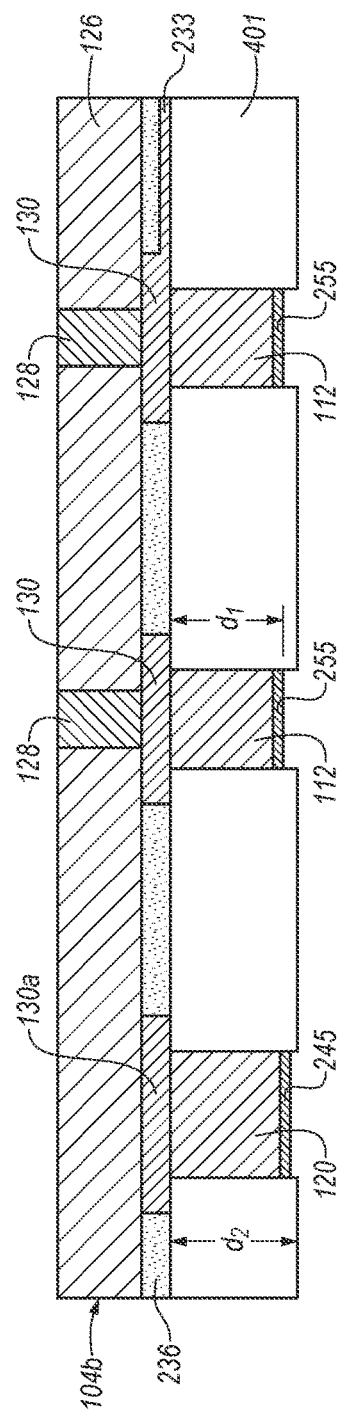

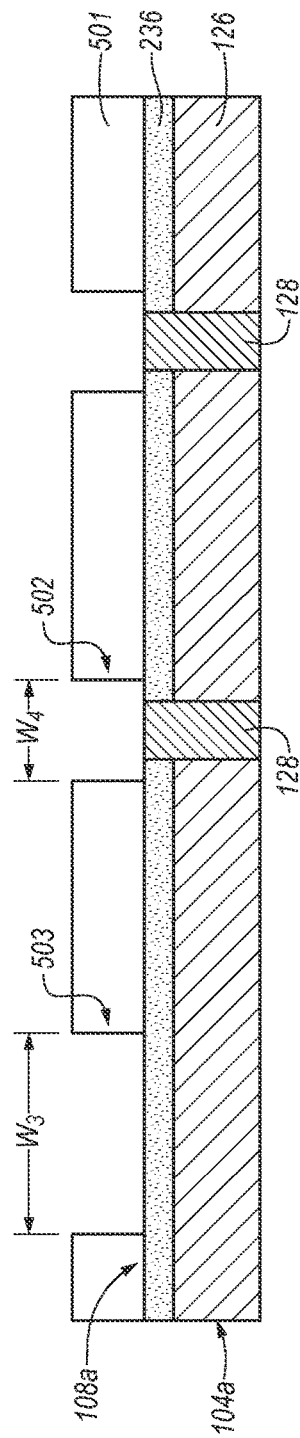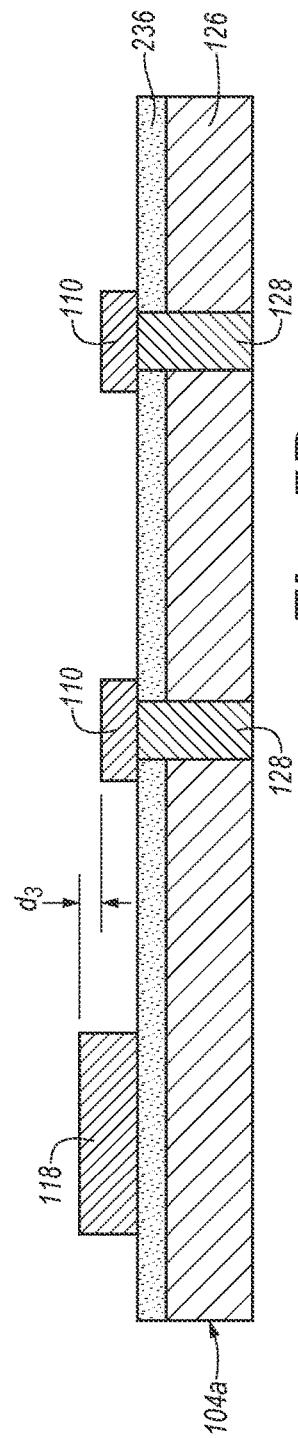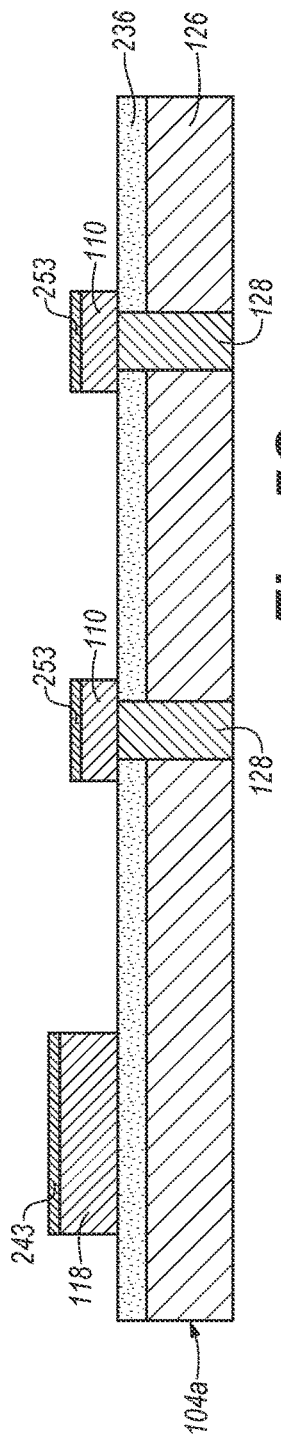

SEMICONDUCTOR DEVICE ASSEMBLY WITH DIE SUPPORT STRUCTURES

CROSS-REFERENCE TO RELATED APPLICATION(S)

This application is a continuation of U.S. patent application Ser. No. 15/603,175, filed May 23, 2017, which is incorporated herein by reference.

This application contains subject matter related to U.S. patent application Ser. No. 15/603,327, filed May 23, 2017, entitled "SEMICONDUCTOR DEVICE ASSEMBLY WITH SURFACE-MOUNT DIE SUPPORT STRUCTURES." The related application, of which the disclosure is incorporated by reference herein, is assigned to Micron Technology, Inc.

TECHNICAL FIELD

The disclosed embodiments relate to semiconductor device assemblies having die support structures. In several embodiments, the present technology relates to die support structures configured to mechanically support mechanical and/or electrical interconnects positioned between stacked semiconductor dies.

BACKGROUND

Semiconductor dies are typically packaged by mounting the die to a substrate and encasing the die within a protective plastic covering and/or metal heat spreader. The die may include functional features, such as memory cells, processor or logic circuits, and power distribution circuits, as well as bond pads electrically connected to the functional features. The bond pads can be electrically connected to terminals outside the protective covering to allow the die to be connected to higher level circuitry. Within some packages, semiconductor dies can be stacked upon and electrically connected to one another by individual interconnects placed between adjacent dies. In such packages, each interconnect can include a conductive material (e.g., solder) and a pair of contacts on opposing surfaces of adjacent dies. For example, a metal solder can be placed between the contacts and reflowed to form a conductive joint.

One challenge with traditional solder joints is that they can be susceptible to breakage during assembly of the dies. For example, the solder joints can be damaged if excessive force is applied during bonding of adjacent dies. This can lead to an open-circuit or high ohmic resistance across the joint, or alternatively can cause the joint to increase in diameter until it mechanically contacts one or more adjacent solder joints, creating an electrical short circuit. Accordingly, there is a need for more mechanically robust solder interconnects between the stacked die within semiconductor device assemblies.

BRIEF DESCRIPTION OF THE DRAWINGS

FIGS. 2A-2C are enlarged cross-sectional views of a semiconductor device assembly showing interconnects and a die support structure configured in accordance with an embodiment of the present technology.

FIGS. 3A and 3B are cross-sectional views illustrating a semiconductor device assembly at various stages in a method of manufacture in accordance with selected embodiments of the present technology.

FIGS. 4A-4C are cross-sectional views illustrating a semiconductor device assembly at various stages in a method for making die support structures in accordance with selected embodiments of the present technology.

FIGS. 5A-5C are cross-sectional views illustrating a semiconductor device assembly at various stages in a method for making die support structures in accordance with selected embodiments of the present technology.

DETAILED DESCRIPTION

Figure 1:
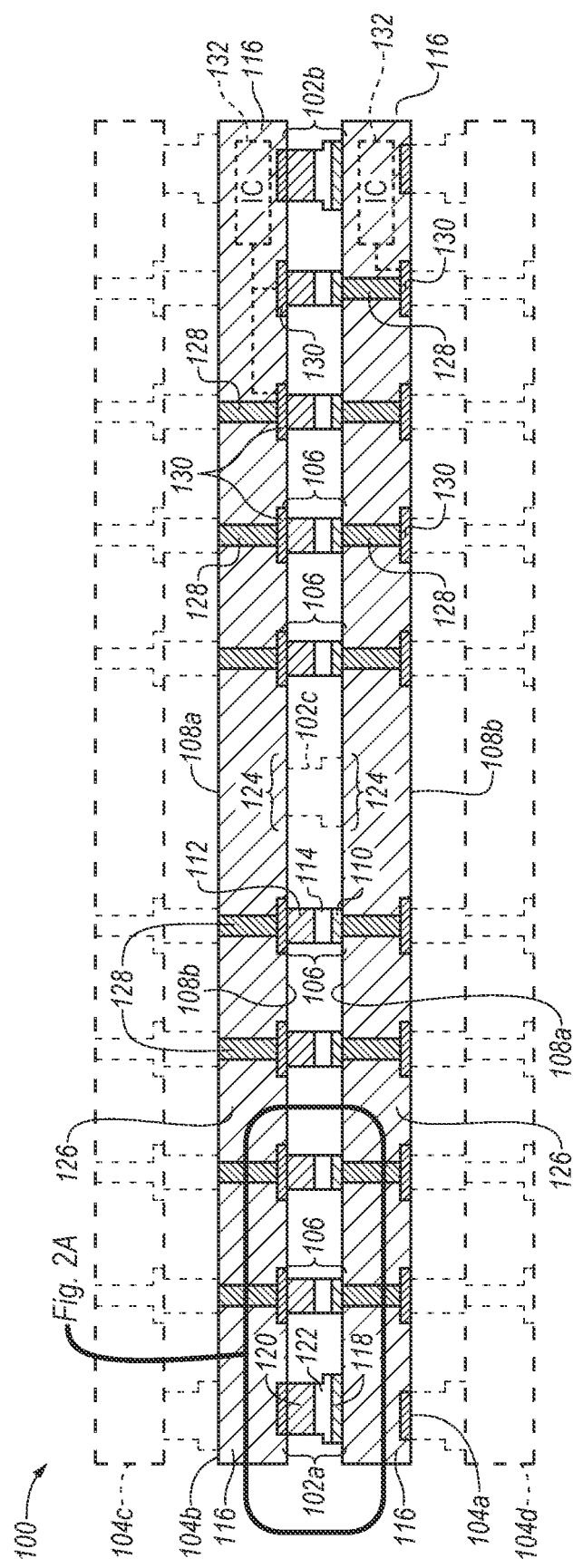
FIG. 1 is a cross-sectional view of a semiconductor device assembly having interconnects and die support structures in accordance with an embodiment of the present technology.

In the following description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with semiconductor devices are not shown, or are not described in detail, to avoid obscuring other aspects of the technology. In general, it should be understood that various other devices, systems, and methods in addition to those specific embodiments disclosed herein may be within the scope of the present technology.

As discussed above, semiconductor devices are continually designed with ever greater needs for increased mechanical robustness. Accordingly, several embodiments of semiconductor device assemblies in accordance with the present technology can include die support structures, which can provide increased mechanical robustness to stacked semiconductor dies of the assembly.

Several embodiments of the present technology are directed to semiconductor device assemblies, semiconductor packages, systems including semiconductor devices, and methods of making and operating semiconductor devices. In one embodiment, a semiconductor device assembly includes a first semiconductor die and a second semiconductor die disposed over the first semiconductor die. The assembly further includes a plurality of die support structures between the first and second semiconductor dies and a plurality of interconnects between the first and second semiconductor dies. Each of the plurality of die support structures includes a stand-off pillar and a stand-off pad having a first bond material with a first solder joint thickness between them. Each of the plurality of interconnects includes a conductive pillar and a conductive pad having a second bond material with a second solder joint thickness between them. The first solder joint thickness is less than the second solder joint thickness.

Embodiments of semiconductor device assemblies having die support structures are described below. In various embodiments, the die support structures can be configured to mechanically support interconnects positioned between stacked dies in a semiconductor device assembly. The die support structures can also optionally be configured to provide electrical interconnection between adjacent dies, or thermal pathways for conducting heat through the stacked dies. The term "semiconductor device assembly" can refer to an assembly of one or more semiconductor devices, semiconductor device packages, and/or substrates (e.g., interposer, support, or other suitable substrates). The semiconductor device assembly can be manufactured, for example, in discrete package form, strip or matrix form, and/or wafer panel form. The term "semiconductor device" generally refers to a solid-state device that includes semiconductor material. A semiconductor device can include, for example, a semiconductor substrate, wafer, panel, or die that is singulated from a wafer or substrate. Throughout the disclosure, semiconductor devices are generally described in the context of semiconductor dies; however, semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor device package can also include an interposer substrate that carries one or more semiconductor devices and is attached to or otherwise incorporated into the casing.

As used herein, the terms "vertical," "lateral," "upper," and "lower" can refer to relative directions or positions of features in the semiconductor device assembly view of the orientation shown in the Figures. For example, "upper" or "uppermost" can refer to a feature positioned closer to the top of a page than another feature. These terms, however, should be construed broadly to include semiconductor devices and semiconductor device assemblies having other orientations, such as inverted or inclined orientations where top/bottom, over/under, above/below, up/down, and left/right can be interchanged depending on the orientation.

FIG. 1 is a cross-sectional view of a semiconductor device assembly 100 ("assembly 100") having first and second die support structures 102a and 102b (collectively "die support structures 102") configured in accordance with an embodiment of the present technology. The assembly 100 includes a first semiconductor die 104a, a second semiconductor die 104b (collectively "semiconductor dies 104"), and an array of individual interconnects 106 extending vertically between first and second sides 108a and 108b of the semiconductor dies 104a and 104b, respectively. The interconnects 106 can each include, for example, a first conductive feature (e.g., a conductive pad 110) on the first side 108a of the first semiconductor die 104a, a second conductive feature (e.g., a conductive pillar 112) on the second side 108b of the second semiconductor die 104b, and a bond material 114 bonding the conductive pillar 112 to the conductive pad 110.

The die support structures 102 extend between peripheral regions 116 of the semiconductor dies 104 on opposite sides of the array of interconnects 106. The die support structures 102 can each include a first protruding feature (e.g., a stand-off pad 118) on the first side 108a of the first semiconductor die 104a, a second protruding feature (e.g., a stand-off pillar 120) on the second side 108b of the second semiconductor die 104b, and optionally a bond material 122 (e.g., a metal solder joint) coupling the stand-off pillar 120 to the stand-off pad 118. In some embodiments, the individual die support structures 102 can be dummy structures that are electrically isolated from other circuit elements of the semiconductor dies 104. In other embodiments, one or more of the die support structures 102 can be configured to provide an electrical interconnection between the semiconductor dies 104 in a manner similar to the interconnects 106. In various embodiments described in greater detail below, the die support structures 102 are configured to mechanically support the dies 104 and prevent or at least inhibit warpage of the dies 104, such as during device manufacture.

In practice, the assembly 100 can include a greater number of interconnects 106 and/or die support structures 102 than shown in the illustrated embodiments. For example, the assembly 100 can include tens, hundreds, thousands, or more interconnects 106 arrayed between the dies 104. Additionally, in various embodiments die support structures 102 can be positioned interstitially between individual and/or groups of interconnects 106 (e.g., between a group of 5, 20, 100, or more interconnects within an array). For example, in some embodiments a die support structure 102c (shown in hidden lines) can be positioned between medial regions 124 near the center of the semiconductor dies 104. In other embodiments, die support structures 102 can be positioned at a variety of other positions between the semiconductor dies 104.

As further shown in FIG. 1, each of the semiconductor dies 104 includes a semiconductor substrate 126 (e.g., a silicon substrate, a gallium arsenide substrate, an organic laminate substrate, etc.) and through-substrate vias (TSVs) 128 extending through the substrate 126 from the first side 108a to the second side 108b of the die 104. The TSVs 128 are coupled to corresponding interconnects 106. In some embodiments, the TSVs 128 can be coupled to substrate pads 130 or other conductive features located on either side of the semiconductor substrate 126.

Each substrate 126 can include integrated circuitry 132 (shown schematically) coupled to one or more of the substrate pads 130 and/or the TSVs 128. The integrated circuitry 132 can include, for example, a memory circuit (e.g., a dynamic random memory (DRAM)), a controller circuit (e.g., a DRAM controller), a logic circuit, and/or other circuits. In some embodiments, the assembly 100 can include other structures and features, such as an underfill material (not shown) deposited or otherwise formed around and/or between the semiconductor dies 104. In the embodiment illustrated in FIG. 1, the assembly 100 includes two semiconductor dies 104. In practice, however, the assembly 100 can include a different number of semiconductor dies, such as three dies, four dies, eight dies, sixteen dies, or more. For example, in another embodiment, the assembly 100 can include a third semiconductor die 104c (shown in hidden lines) on the second semiconductor die 104b, and a fourth semiconductor die 104d (shown in hidden lines) on the first semiconductor die 104a. In some embodiments, the assembly 100 can include a casing (not shown), such as a thermally conductive casing, that encloses the semiconductor dies 104 within an enclosure. In these and other embodiments, the assembly 100 can include a support substrate (not shown), such as an interposer and/or a printed circuit board, configured to operably couple the semiconductor dies 104 to external circuitry (not shown).

FIG. 2A is an enlarged cross-sectional view showing several interconnects 106 and the die support structure 102a configured in accordance with an embodiment of the present technology. Referring to FIG. 2A, the die support structure 102a includes the stand-off pad 118, the stand-off pillar 120, and the bond material 122 coupling an end portion of the stand-off pillar 120 to an end portion of the stand-off pad 118. Each interconnect 106 includes a conductive pad 110, a conductive pillar 112, and a bond material 114 coupling an end portion of the conductive pillar 112 to an end portion of the conductive pad 110. The conductive pad 110 can be coupled to or form a part of a first redistribution structure 265a formed on the first side 108a of the first semiconductor die 104a. The conductive pillar 112 can be coupled to or form a part of a second redistribution structure 265b formed on the second side of the second semiconductor die 104b.

Each of the redistribution structures 265 can include various conductive features 233 and a passivation material 236 (e.g., an oxide material) configured to provide electrical isolation between the conductive features 233. The conductive features 233 can include, for example, individual metal traces and/or pads that are coupled to one or more of the interconnects 106, the substrate pads 130 (FIG. 1), the TSVs 128, etc.

Figure 2B:
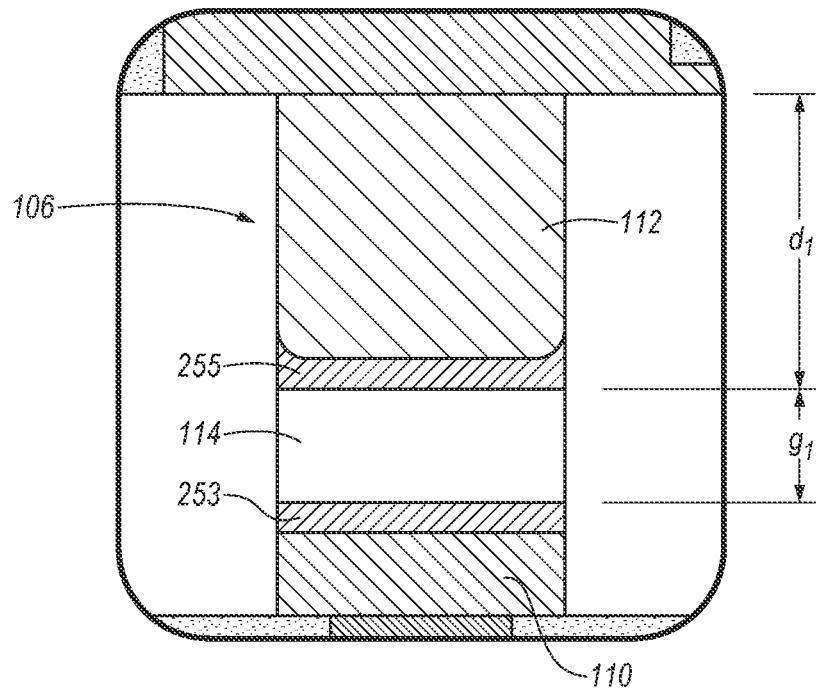

FIG. 2B is a further enlarged cross-sectional view showing one of the interconnects 106 in even more detail, in accordance with one aspect of the present technology. The conductive pillar 112 of the interconnect 106 includes an end portion attached to the conductive pad 110 by the bond material 114. The interconnect 106 can also include a first barrier material 255 (e.g., nickel, nickel-based intermetallic and/or gold) formed over the end portion of the conductive pillar 112, and second barrier material 253 (e.g., nickel, nickel-based intermetallic and/or gold) formed over the conductive pad 110. The barrier materials can facilitate bonding and/or prevent or at least inhibit the electromigration of copper or other metals used to form the conductive pillar 112 and the conductive pad 110. The bond material 114 bridges a first gap $g_1$ (also known to those skilled in the art as a solder joint thickness) between the conductive pillar 112 and the conductive pad 110. The solder joint thickness $g_1$ is dictated at least in part by a first projection height $d_1$ of the conductive pillar 112 from the second side 108b of the second semiconductor die 104b.

Figure 2C:
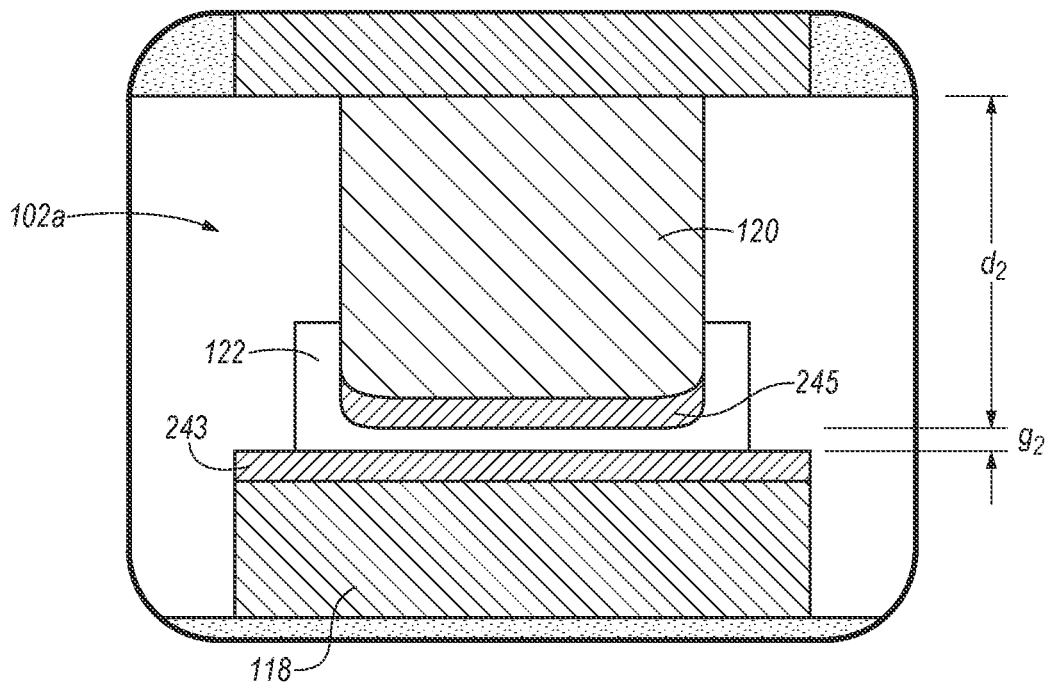

FIG. 2C is a further enlarged cross-sectional view showing the die support structure 102a of FIG. 2A in even more detail. The die support structure 102a further includes a bond material 122, a first barrier material 243 (e.g., nickel, nickel-based intermetallic and/or gold) between the bond material 122 and the stand-off pad 118, and a second barrier material 245 (e.g., nickel, nickel-based intermetallic and/or gold) between the bond material 122 and the stand-off pillar 120. The stand-off pillar 120 of the die support structure 102a projects from the second side 108b of the second semiconductor die 104b to a second height $d_2$ greater than the first height $d_1$ of the conductive pillar 112 of the individual interconnects 106. This reduces the size of a second gap $g_2$ (e.g., a die support structure solder joint thickness) bridged by the bond material 122 of the die support structure 102a relative to the first gap $g_1$ bridged by the bond material 114 of the individual interconnects 106. As a result, the die support structure 102 has a smaller solder joint thickness $g_2$ than the solder joint thickness $g_1$ of the interconnects 106. In some embodiments, the stand-off pad 118 can also project from the first side 108a of the first semiconductor die 104a by a greater amount than conductive pad 110, further reducing the size of the second gap $g_2$ relative to the first gap $g_1$.

In accordance with one aspect of the present technology, providing a device assembly 100 with die support structures 102 having a smaller solder joint thickness $g_2$ than the solder joint thickness $g_1$ of the interconnects 106 of the device assembly 100 simplifies and improves the yield of the manufacturing of the device assembly 100. In this regard, one challenge with forming interconnects between semiconductor dies is that semiconductor dies can have an intrinsic amount of die warpage, which can produce tensile and/or compressive forces on the interconnects between dies. In the absence of a die support structure, these forces can damage the interconnects during assembly of the device, either pulling interconnects apart (e.g., the tensile force) and causing open circuits, or excessively compressing interconnects (e.g., the compressive force) and causing the bond materials from adjacent interconnects to meet and create short circuits. By providing die support structures 102 around peripheral regions 116 of a die (e.g., and optionally in medial regions 124), a thermo-compressive bonding operation can be used to minimize the solder joint thickness $g_2$ of the die support structures 102 (e.g., to compress the die support structures 102 until the stand-off pillars 120 meet or nearly meet stand-off pads 118) while maintaining the solder joint thickness $g_1$ of the interconnects 106 within a desired range. The compressive bonding operation can also counteract any intrinsic die warpage by forcing a die or dies into parallel planar alignment, not only in an uppermost die being added to a stack, but in every die in the stack that might otherwise be subject to warpage during inadvertent reflow of its solder connections.

In accordance with another aspect of the present technology, the mechanical strength of the die support structures 102 can permit a thermo-compressive bonding operation to utilize force feedback as a control mechanism for the operation, rather than a spatial z-dimension offset, which can further simplify and improve the quality of the bonding operation. For example, during a thermo-compressive bonding operation, a force can be applied to a stack of two or more dies while the bond materials in the die support structures 102 and interconnects 106 are reflowed, such that the die support structures are fully compressed (e.g., the stand-off pillars 120 meet or nearly meet stand-off pads 118) and a measured resistance to the force is determined to increase as a result. The measured increase in resistance to the applied compressive force can be used to determine that the gap $g_2$ between at least some of the stand-off pillars 120 and stand-off pads 118 has been reduced to about 0, and that the gap $g_1$ between the conductive pillars 112 and the conductive pads 110 has therefore been reduced to within a known range (e.g., due to the predetermined difference between the height $d_1$ of the conductive pillars 112 and the height $d_2$ of the stand-off pillars 120 and optionally the height $d_3$ of the stand-off pads 118). As will be readily apparent to those skilled in the art, measuring the resistance to a compressive force in such a bonding operation is a much simpler engineering challenge than measuring the z-dimension offset of a bond head over such a small range (e.g., measuring offsets of less than 1 μm).

In accordance with one aspect of the subject technology, depending upon the tolerance of the manufacturing steps used to fabricate the conductive pillars 112 and the stand-off pillars 120, there may be some variation in the height thereof (e.g., such that individual ones of the conductive pillars 112 and the stand-off pillars 120 may be anywhere from 1 to 5 μm out of co-planar alignment). Accordingly, the gap $g_2$ between at least some of the stand-off pillars 120 and stand-off pads 118 may be greater than 0 at the end of the thermo-compressive bonding operation. Nevertheless, as will be readily apparent to one skilled in the art, the thermo-compressive bonding operation will cause many corresponding pairs of the stand-off pillars 120 and stand-off pads 118 to come into contact, or nearly into contact, such that an end of the thermo-compressive bonding operation can be detected.

FIGS. 3A and 3B are cross-sectional views illustrating semiconductor device assembly 100 at various stages in a method of manufacture in accordance with selected embodiments of the present technology. In FIG. 3A, assembly 100 is illustrated at the beginning of a thermo-compressive bonding operation, in which the heating has caused the bond material 114 in the interconnects 106 to reflow and electrically connect the first and second barrier materials 255 and 253 of the conductive pillar 112 and the conductive pad 110, respectively. The heat has similarly caused the bond material 122 in the die support structures 102 to reflow and wet the first and second barrier materials 243 and 245 of the stand-off pad 118 and the stand-off pillar 120, respectively. Before exerting the compressive force and heat, the gap $g_2$ bridged by the bond material 122 of the die support structure 102a is larger than about 0 and the gap $g_1$ bridged by the bond material 114 of the interconnect 106 is larger than a desired final amount.

In FIG. 3B, assembly 100 is illustrated at the completion of the thermo-compressive bonding operation, in which the compressive force has caused the gap $g_2$ between the stand-off pad 118 and the stand-off pillar 120 (e.g., the gap between the barrier materials 243 and 245) to be reduced to about 0 μm, and the gap $g_1$ bridged by the bond material 114 of the interconnect 106 to be reduced to within a desired range. As can be seen with reference to FIG. 3B, the greater width of the stand-off pad 118 relative to the stand-off pillar 120 permits the excess bond material 122 to remain attached to the stand-off pad 118, reducing the risk of the bond material 122 shorting to adjacent conductive structures. By cooling assembly 100 at this point, the bond materials 122 and 114 can be solidified, securing the semiconductor dies 104a and 104b in a parallel planar alignment (e.g., overcoming any intrinsic warpage) into which the compressive operation has forced them.

In accordance with one aspect of the present technology, the inclusion of die support structures on a wafer or panel allows wafer- or panel-level assembly of die stacks without experiencing the reduction in yield caused by die warpage defects in traditional wafer- or panel-level assembly operations. In this regard, the arrangement of die support structures on a wafer or panel can be selected to balance a need for warpage mitigation with an amount of real estate dedicated to the die support structures (e.g., due to the greater size of the support structures than the interconnects). In one embodiment, the loss of usable die area due to the inclusion of die support structures can be mitigated by utilizing electrically active die support structures to replace interconnects (e.g., by electrically connecting a die support structure to circuit elements in the dies) rather than using dummy (e.g., electrically isolated or not active) die support structures that provide no electrical function in the circuits of the dies.

In accordance with another aspect of the present technology, the use of a bond material 122 in the die support structure 102 can provide mechanical support to counteract the tensile forces tending to pull apart interconnects 106 due to intrinsic die warpage. Accordingly, in one embodiment, the stand-off pillar 120 and stand-off pad 118 can be made of a solder-wettable material (e.g., copper, gold, alloys thereof, etc.). In another embodiment, however, where tensile forces are of less concern, the bond material 122 may be omitted from a support structure 102, which can still provide mechanical support during a thermo-compressive bonding operation in the absence of any bond material (e.g., due to the greater height of the stand-off pillar 120 than the conductive pillars 112 of the interconnects 106). One benefit of using die support structures 102 which are larger than (e.g., have a greater width than) the interconnects 106 is the improved mechanical support that the die support structures 102 can provide against tensile and compressive forces (e.g., the die support structures 102 are more mechanically robust and can better endure compression during a thermo-compressive bonding operation, and moreover have greater surface area for bonding pillars and pads to thereby better resist tensile forces).

Another benefit of using die support structures 102 which have a greater width than the interconnects 106 is that a single operation can be used to plate the stand-off pillars and the conductive pillars to different heights, thereby simplifying manufacturing. In this regard, a pillar-plating operation in which the eventual height of a pillar is dependent upon the width of a mask opening in which the pillar is plated can be used. For example, FIGS. 4A to 4C are cross-sectional views illustrating the second semiconductor die 104b at various stages in a method for making die support structures 102 and interconnects 106 in accordance with an embodiment of the present technology. Referring first to FIG. 4A, the second semiconductor die 104b is shown after the TSVs 128 have been formed in the substrate 126 and the conductive trace 233 and substrate pads 130 and 130a have been formed in the dielectric material 236 over the substrate 126. As shown, some of the pads 130 (e.g., on which interconnects are to be formed) are coupled to TSVs 128 or to conductive traces 233. Another substrate pad 130a (e.g., on which a die support structure is to be formed) is electrically isolated by the dielectric material 236. In several embodiments, the conductive trace 233 and the substrate pads 130 and 130a can each include copper, gold, alloys thereof, and/or other suitable conductive materials.

FIG. 4B shows the second semiconductor die 104b after forming a mask 401 (e.g., a photoresist mask, hard mask, etc.) over the die 104b, with openings 402 and 403 over the substrate pads 130 and 130a. As shown in FIG. 4B, the openings 402 and 403 expose portions of the underlying substrate pads 130 and 130a. As can be seen with reference to FIG. 4B, the opening 403 over substrate pad 130a over which a stand-off pillar 120 for a die support structure 102 will be plated has a width $w_1$ that is greater than the width $w_2$ of the opening 402 over the substrate pad 130 over which a conductive pillar 112 for an interconnect 106 will be plated. The greater width $w_1$ of the opening 403 will permit a taller stand-off pillar to be plated over the substrate pad 130a in a subsequent step (e.g., the same step in which conductive pillars are plated over substrate pads 130), as the height of a pillar formed by the plating operation is at least in part dependent upon the width of the opening in which the pillar is plated.

Turning to FIG. 4C, the second semiconductor die 104b is shown after stand-off pillars 120 and conductive pillars 112 have been formed on the substrate pads 130a and 130, respectively. In several embodiments, the conductive pillars 112 and stand-off pillars 120 can be formed by depositing a seed material, creating a photo resist mask and electroplating a conductive material (e.g., copper) over the seed material in the photo resist mask openings 402 and 403 on the substrate pads 130 and 130a. In other embodiments, the conductive pillars 112 and stand-off pillars 120 can be formed by other suitable deposition techniques, such as sputter deposition. By using a method for forming the conductive pillars and stand-off pillars in which the rate of growth of the conductive material is dependent upon the width of the mask opening, a single operation can provide stand-off pillars 120 (e.g., which will be used to form die support structures 102) with a greater height $d_2$ than the height $d_1$ of the conductive pillars 112 (e.g., which will be used to form interconnects 106). In the illustrated embodiment, a barrier material 245 and 255 (e.g., nickel, nickel-based intermetallic and/or gold) has also been electroplated in sequence onto the conductive material of the stand-off pillar 120 and conductive pillars 112. The barrier materials 245 and 255 can facilitate bonding and/or prevent or at least inhibit the electromigration of copper or other metals used to form the conductive pillars 112 and the stand-off pillars 120 in subsequent steps.

In one embodiment of the present technology, the stand-off pads 118 used in the formation of die support structures 102 may have greater widths than the conductive-pads 110 used in the formation of die interconnects 106, both to provide increased robustness for the die support structures, and to facilitate the growth of stand-off pads 118 to a greater height than that of the conductive pads 110, using a single plating operation. For example, FIGS. 5A to 5C are cross-sectional views illustrating the first semiconductor die 104a at various stages in a method for making die support structures 102 and interconnects 106 in accordance with an embodiment of the present technology. Referring first to FIG. 5A, the first semiconductor die 104a is shown after the TSVs 128 have been formed in the substrate 126 and the dielectric layer 236 has been disposed over the substrate 126 and patterned with a mask 501 (e.g., a photoresist mask, hard mask, etc.) having openings 502 and 503. The opening 502 over the TSV 128 will form the site for a plating operation for a conductive pad 110 for an eventual interconnect 106, while the opening 503 over the substrate 126 (e.g., isolated from other circuit elements in this embodiment) will form the site for a plating operation for a stand-off pad 118 for an eventual die support structure 102. As can be seen with reference to FIG. 5A, the opening 503 in which a stand-off pad 118 will be formed has a greater width $w_3$ than the width $w_4$ of the opening 502 in which the conductive pad 110 will be formed. The greater width $w_3$ of the opening 503 will permit a taller stand-off pad to be plated over the substrate 126 in a subsequent step (e.g., the same step in which conductive pads are plated over TSVs 128), as the height of a pad formed by the plating operation is at least in part dependent upon the width of the opening in which the pad is plated.

Turning to FIG. 5B, the first semiconductor die 104a is shown after stand-off pads 118 and conductive pads 110 have been formed. In several embodiments, the conductive pads 110 and stand-off pads 118 can be formed by depositing a seed material, creating a photo resist mask and electroplating a conductive material (e.g., copper) over the seed material in the mask openings 502 and 503 on the dielectric layer 236 and/or TSVs 128. In other embodiments, the conductive pads 110 and stand-off pads 118 can be formed by other suitable deposition techniques, such as sputter deposition. By using a method for forming the conductive pads and stand-off pads in which the rate of growth of the conductive material is dependent upon the width of the mask opening, a single operation can provide stand-off pads 118 (e.g., which will be used to form die support structures 102) with a greater height than the height of the conductive pads 110 (e.g., which will be used to form interconnects 106). As can be seen with reference to FIG. 5B, the stand-off pad 118 extends above the conductive pads 110 by a height $d_3$.

Turning to FIG. 5C, the first semiconductor die 104a is shown after a barrier material 243 and 253 (e.g., nickel, nickel-based intermetallic and/or gold) has been electroplated in sequence onto the conductive material of the stand-off pads 118 and conductive pads 110. The barrier materials can facilitate bonding and/or prevent or at least inhibit the electromigration of copper or other metals used to form the conductive pads 110 and the stand-off pads 118 in subsequent steps.

Figure 6:
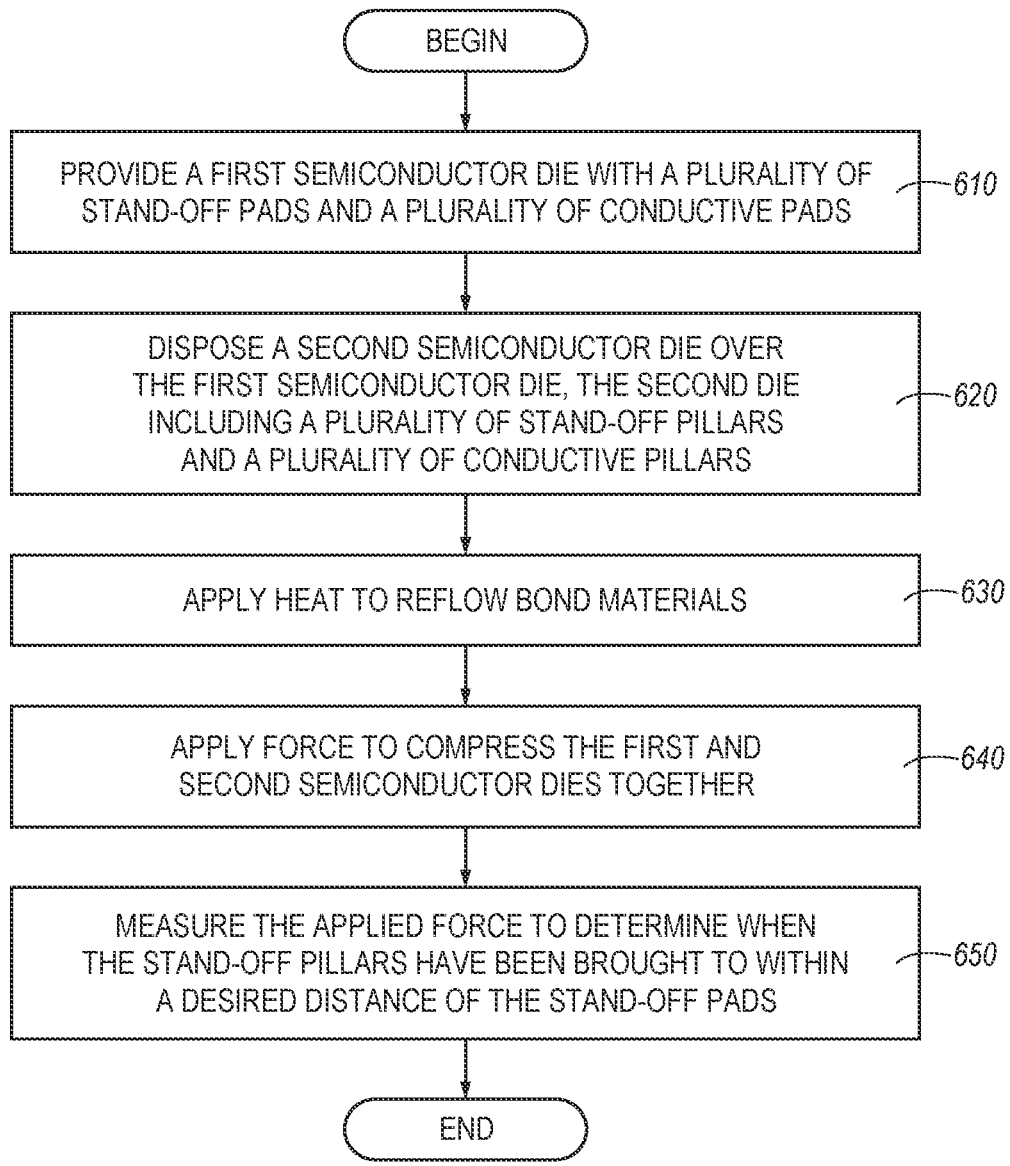
FIG. 6 is a flow chart illustrating a method of making a semiconductor device assembly in accordance with one embodiment of the present technology.

FIG. 6 is a flow chart illustrating a method for making a semiconductor device in accordance with one aspect of the present technology. The method includes providing a first semiconductor die including a plurality of stand-off pads and a plurality of conductive pads (box 610) and disposing a second semiconductor die over the first semiconductor die (box 620). The second semiconductor die includes a plurality of stand-off pillars having a first height and a plurality of conductive pillars having a second height less than the first height. Each of the plurality of stand-off pillars is separated from a corresponding one of the plurality of stand-off pads by a first bond material, and each of the plurality of conductive pillars is separated from a corresponding one of the plurality of conductive pads by a second bond material. The method further includes reflowing the first and second bond materials (box 630) and moving at least one of the first semiconductor die and the second semiconductor die towards each other, such that each of the plurality of stand-off pillars contacts the corresponding one of the plurality of stand-off pads (box 640). The method can further include measuring the applied force to determine when the plurality of stand-off pillars contact the plurality of stand-off pads (box 650).

Figure 7:
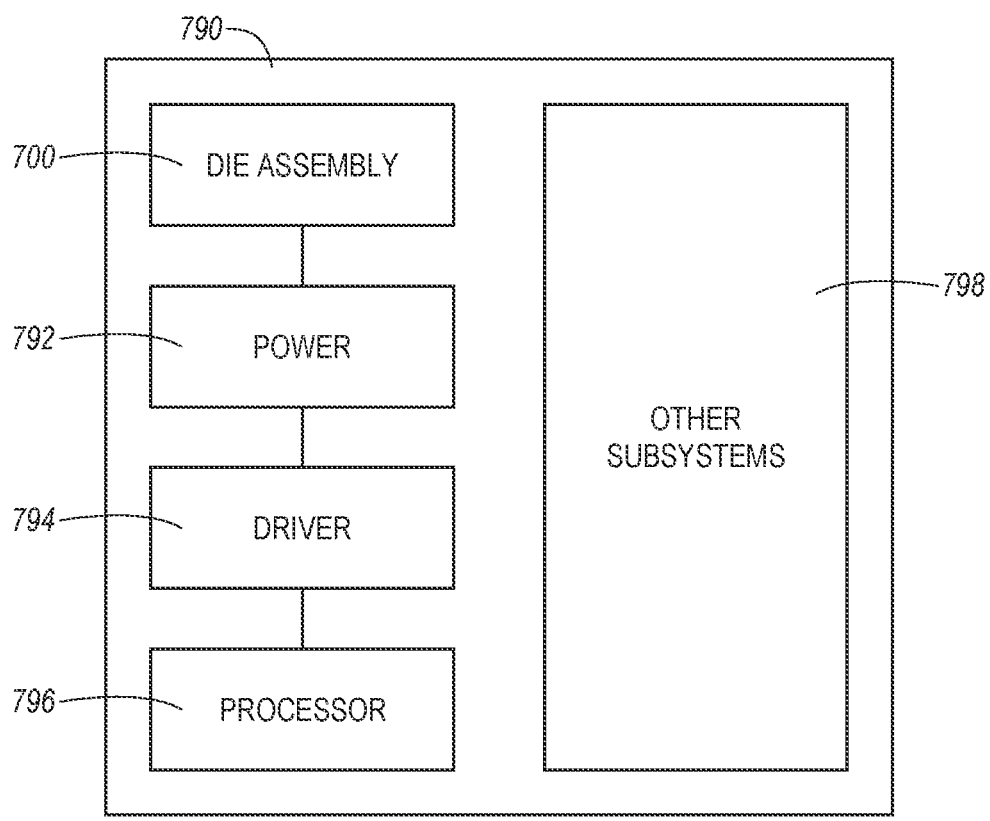
FIG. 7 is a schematic view of a system that includes a semiconductor device assembly configured in accordance with an embodiment of the present technology.

Any one of the die support structures and/or semiconductor device assemblies described above with reference to FIGS. 1 through 6 can be incorporated into any of a myriad of larger and/or more complex systems, a representative example of which is system 790 shown schematically in FIG. 7. The system 790 can include a semiconductor device assembly 700, a power source 792, a driver 794, a processor 796, and/or other subsystems or components 798. The semiconductor device assembly 700 can include features generally similar to those of the semiconductor device assemblies described above, and can therefore include die support structures for mechanically supporting interconnects positioned between stacked semiconductor dies of the assembly. The resulting system 790 can perform any of a wide variety of functions such as memory storage, data processing, and/or other suitable functions. Accordingly, representative systems 790 can include, without limitation, hand-held devices (e.g., mobile phones, tablets, digital readers, and digital audio players), computers, vehicle and other machines and appliances. Components of the system 790 may be housed in a single unit or distributed over multiple, interconnected units (e.g., through a communications network). The components of the system 790 can also include remote devices and any of a wide variety of computer readable media.

From the foregoing, it will be appreciated that specific embodiments of the technology have been described herein for purposes of illustration but that various modifications may be made without deviating from the disclosure. Moreover, although advantages associated with certain embodiments of the new technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:
1. A Semiconductor package comprising a plurality of dies arranged in a stack,
   wherein adjacent ones of the plurality of dies are separated by a plurality of interconnects and a plurality of die support structures, wherein each of the plurality of die support structures includes a stand-off pillar and a stand-oil pad with a first distance between the stand-off pillar and the stand-off pad, wherein each of the plurality of interconnects includes a conductive pillar, a conductive pad, and a bond material with a solder joint thickness between the conductive pillar and the conductive pad, and wherein the first distance is less than the solder joint thickness, wherein the stand-off pad of each of the plurality of die support structures extends from a first planar surface of the first semiconductor die by a greater amount than the conductive pad of each of the plurality of interconnects extends from the first planar surface, and wherein the stand-oft pillar of each of the plurality of die support structures extends front a second planar surface of the second semiconductor die by a greater amount than the conductive pillar of each of the plurality of interconnects extends from the second planar surface.

2. The semiconductor package of claim 1, wherein the plurality of die support structures includes die support structures disposed about a periphery of the semiconductor package.

3. The semiconductor package of claim 1, wherein the plurality of die support structures includes die support structures disposed in a medial region of the semiconductor device assembly.

4. The semiconductor package of claim 1, wherein the plurality of dies includes more than two dies.

5. The semiconductor package of claim 1, wherein the plurality of dies includes at least one memory die.

6. The semiconductor package of claim 1, wherein each of the plurality of die support structures includes a second bond material between the stand-off pillar and the stand-off pad.

7. The semiconductor device assembly of claim 1, wherein the stand-off pillar of each of the plurality of die support structures has a first width and wherein the conductive pillar of each of the plurality of interconnects has a second width less than the first width.

8. The semiconductor device assembly of claim 1, wherein the stand-off pad of each of the plurality of die support structures has a first width and wherein the conductive pad of each of the plurality of interconnects has a second width of less than the first width.

9. The semiconductor device assembly of claim 1, wherein the stand-off pad of each of the plurality of die support structures has a first width and wherein the stand-off pillar of each of the plurality of die support structures has a second width of less than the first width.

* * * * *